United States Patent
Tokitoh (12)

(10) Patent No.: US 6,482,732 B1
(45) Date of Patent: Nov. 19, 2002

(54) METHOD AND APPARATUS FOR POLISHING SEMICONDUCTOR WAFER

(75) Inventor: Shunichi Tokitoh, Kanagawa (JP)

(73) Assignee: OKI Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/894,886

(22) Filed: Jun. 29, 2001

(51) Int. Cl.7 .................... H01L 21/4763; H01L 21/44
(52) U.S. Cl. .................... 438/631; 438/626; 438/645; 438/687; 438/692; 438/693
(58) Field of Search .................... 438/692, 693, 438/695, 697, 700, 687, 626, 631, 645

(56) References Cited

U.S. PATENT DOCUMENTS

| | | | | |
|---|---|---|---|---|
| 5,643,050 A | * | 7/1997 | Chen | 451/10 |
| 5,647,952 A | * | 7/1997 | Chen | 156/636.1 |
| 5,775,980 A | * | 7/1998 | Sasaki et al. | 451/285 |
| 6,083,838 A | * | 7/2000 | Burton et al. | 438/691 |
| 6,121,144 A | * | 9/2000 | Marcyk et al. | 438/692 |
| 6,136,714 A | * | 10/2000 | Schutz | 438/692 |
| 6,315,635 B1 | * | 11/2001 | Lin | 451/7 |
| 6,358,360 B2 | * | 3/2002 | Takahashi | 438/690 |
| 2001/0041446 A1 | * | 11/2001 | Takahashi | 438/692 |
| 2001/0055940 A1 | * | 12/2001 | Swanson | 451/53 |

FOREIGN PATENT DOCUMENTS

| JP | 09/306879 | 11/1997 |
|---|---|---|
| JP | 2000-015561 | 1/2000 |

* cited by examiner

*Primary Examiner*—Olik Chaudhuri
*Assistant Examiner*—Timothy J. Sutton
(74) *Attorney, Agent, or Firm*—Rabin & Berdo, P.C.

(57) ABSTRACT

A method for polishing a semiconductor wafer, includes the steps of supplying a polishing slurry between a polishing pad and a semiconductor wafer; polishing a surface of the semiconductor wafer with the polishing pad in a CMP process; and controlling the temperature of the polishing slurry to be in a range between 2° C. to 10° C. while the semiconductor wafer is polished.

12 Claims, 8 Drawing Sheets

METHOD AND APPARATUS FOR POLISHING SEMICONDUCTOR WAFER

TECHNICAL FIELD OF THE INVENTION

The present invention relates to semiconductor fabrication technology, and more particularly to, a method for polishing a semiconductor wafer by CMP technique to form a required conductive pattern on the wafer.

BACKGROUND OF THE INVENTION

Wiring patterns have a narrower width as a semiconductor integrated circuit becomes smaller in size. In order to decrease wiring delay, a wiring pattern formed from copper, which has a resistance smaller than aluminum, came into use. It is difficult to dry-etch copper, so that copper patterns are formed by a Damascene process. In a Damascene process, a trench in an insulating layer is filled with copper, and unnecessary copper is removed by a CMP (Chemical Mechanical Polishing) technique to form a pre-designed copper pattern.

According to a Damascene process, an SiN layer is formed on an insulating layer. Next, another insulating layer is formed on the SiN layer. Subsequently, the insulating layer is etched to form a trench using the SiN layer as an etching stop layer. The trench is used for forming a conductive pattern. After that, a TaN layer is formed over a surface of the entire structure by a sputtering process. Then, a Cu (Copper) layer is formed over the TaN layer, which is a barrier layer, so that the trench is filled up with Cu sufficiently.

A CMP process is carried out to polish and shape the Cu layer to form a conductive wiring pattern. Such a CHEMICAL-MECHANICAL POLISHING process includes the steps of removing the top of the Cu layer; removing the top of the barrier layer and removing particles for clean up the wafer. When removing the Cu layer and barrier layer, a polishing slurry is used in the CMP process. The conventional CMP apparatus use a polishing slurry at room temperature.

According to the above-described conventional Damascene process, undesirable dishing occurs. In more detail, the Cu layer may be over polished. As a result, the Cu wiring pattern is shaped not to have an enough height.

OBJECTS OF THE INVENTION

Accordingly, an object of the present invention is to provide a method and apparatus for polishing a semiconductor wafer in which dishing of a conductive pattern is decreased.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

A method for polishing a semiconductor wafer, includes the steps of: supplying a polishing slurry between a polishing pad and a semiconductor wafer; polishing a surface of the semiconductor wafer with the polishing pad in a CMP process; and controlling the temperature of the polishing slurry to be in a range between 2° C. to 10° C. while the semiconductor wafer is polished.

Preferably, the polishing process comprises first and second steps, in which the temperature of the polishing slurry is controlled to be at the room temperature in the first step and is controlled to be in a range between 2° C. to 10° C. in the second step.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1A:
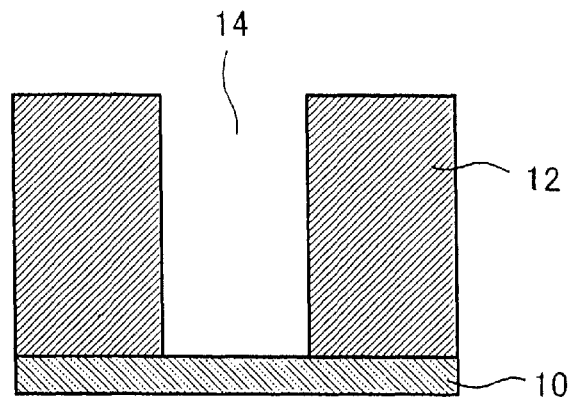
FIGS. 1A to 1C are cross sectional view showing fabricating steps according to a conventional Damascene process.
Figure 1B:
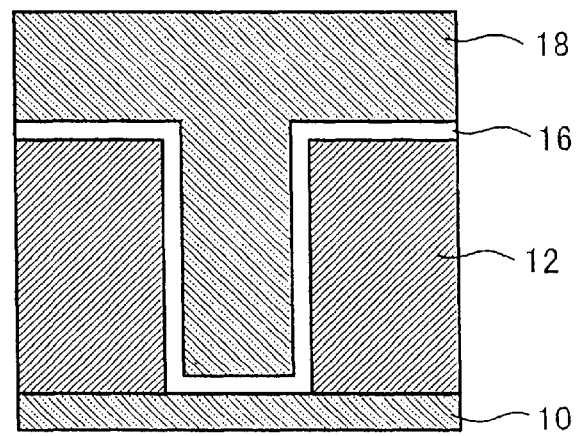
Figure 1C:
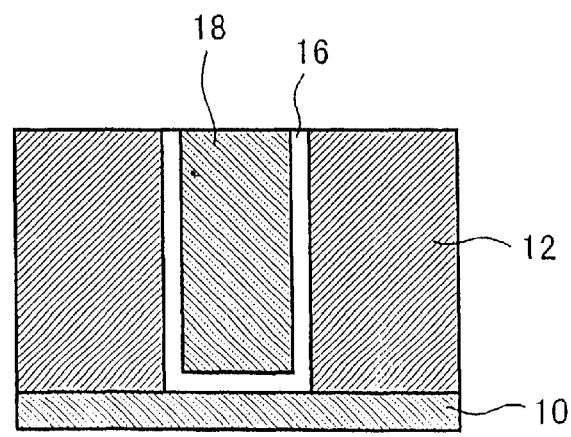
Figure 2:
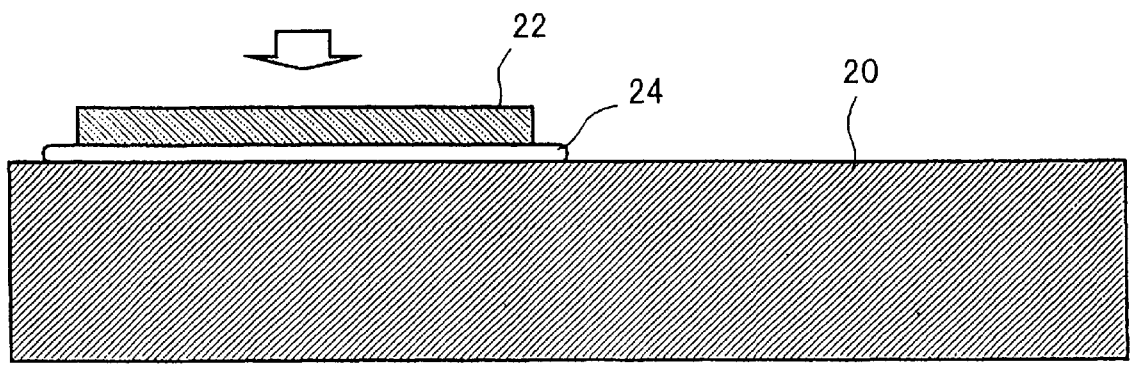
FIG. 2 is a cross sectional view showing a part of a conventional CMP apparatus.

For better understanding of the present invention, a conventional technology is first described in conjunction with FIGS. 1A to 1C, 2, 3A and 3B. FIGS. 1A to 1C are cross sectional views showing fabricating steps according to a conventional Damascene process. FIG. 2 is a cross sectional view showing a part of a conventional CMP apparatus. As shown in FIG. 1A, a SiN layer 10 is formed on an insulating layer (not shown) to have a thickness of 100 nm. Next, another insulating layer 12 is formed on the SiN layer 10 to have a thickness of 500 nm. The insulating layer 12 is etched to form a trench 14 using the SiN layer 10 as an etching stop layer. The trench 14 is to be used for forming a conductive pattern.

Now, referring to FIG. 1B, a TaN layer 16 is formed over a surface of the entire structure to have a thickness of 50 nm, by a sputtering process. Next, a Cu (Copper) layer 18 is formed over the TaN layer 16, which is a barrier layer, so that the trench 14 is filled up with Cu (18) sufficiently.

Referring to FIG. 1C, a CMP process is carried out to polish and shape the Cu layer 18 to form a conductive wiring pattern (18). Such a CMP process includes the steps of removing the top of the Cu layer 18; removing the top of the barrier layer 16 and removing particles to clean up the wafer. When removing the Cu layer 18 and barrier layer 16, a polishing slurry is used in the CMP process. The conventional CMP apparatus use polishing slurry at room temperature, for example 27° C.

In such a CMP process, as shown in FIG. 2, the polishing slurry 24 is supplied between the polishing pad 20 and semiconductor wafer 22 at least when the wafer 22 is polished. The polishing pad 20 and semiconductor wafer 22 are relatively moved or slide under a predetermined pressure to polish the lower surface of the semiconductor wafer 22.

Figure 3A:
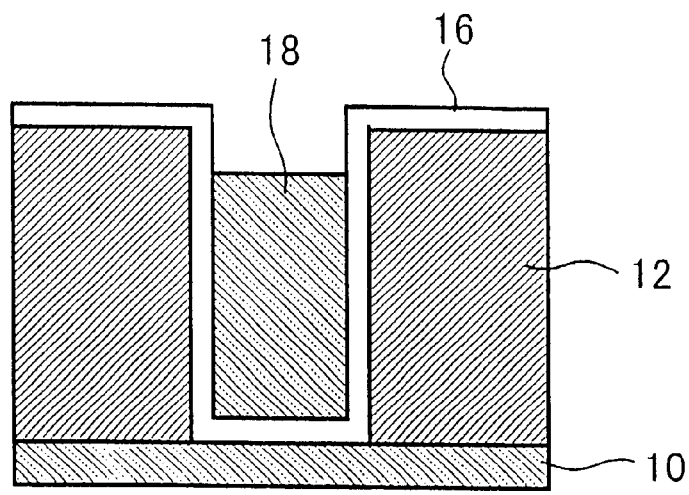
FIGS. 3A and 3B are cross sectional views showing results by a conventional Damascene process, in which undesirable dishing occurs.
Figure 3B:
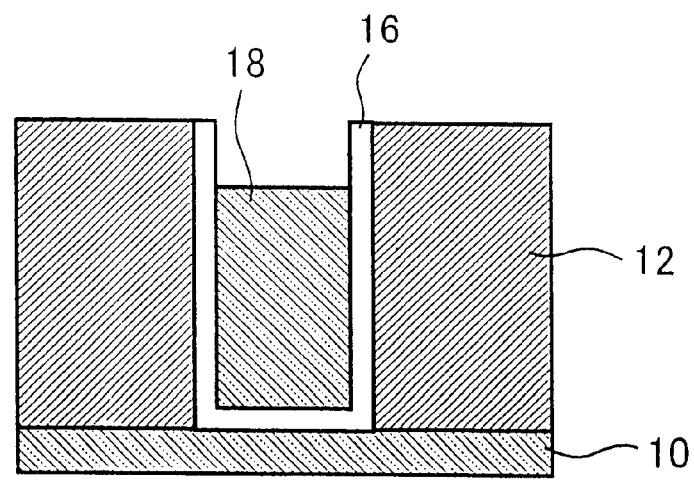

FIGS. 3A and 3B are cross sectional views showing results by a conventional Damascene process, in which undesirable dishing occurs. As shown in FIG. 3A, the Cu layer 18 may be over polished; and as a result, the Cu wiring pattern (18) is shaped not to have enough height, as shown in FIG. 3B.

Figure 4:
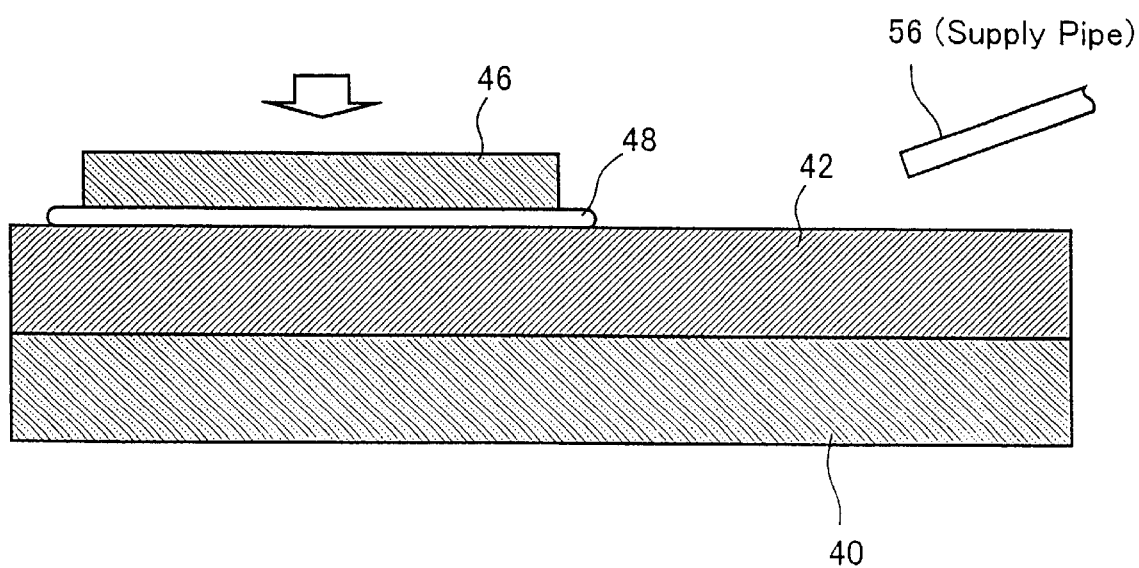
FIG. 4 is a cross sectional view showing a part of a CMP apparatus according to a first preferred embodiment of the present invention.
Figure 5:
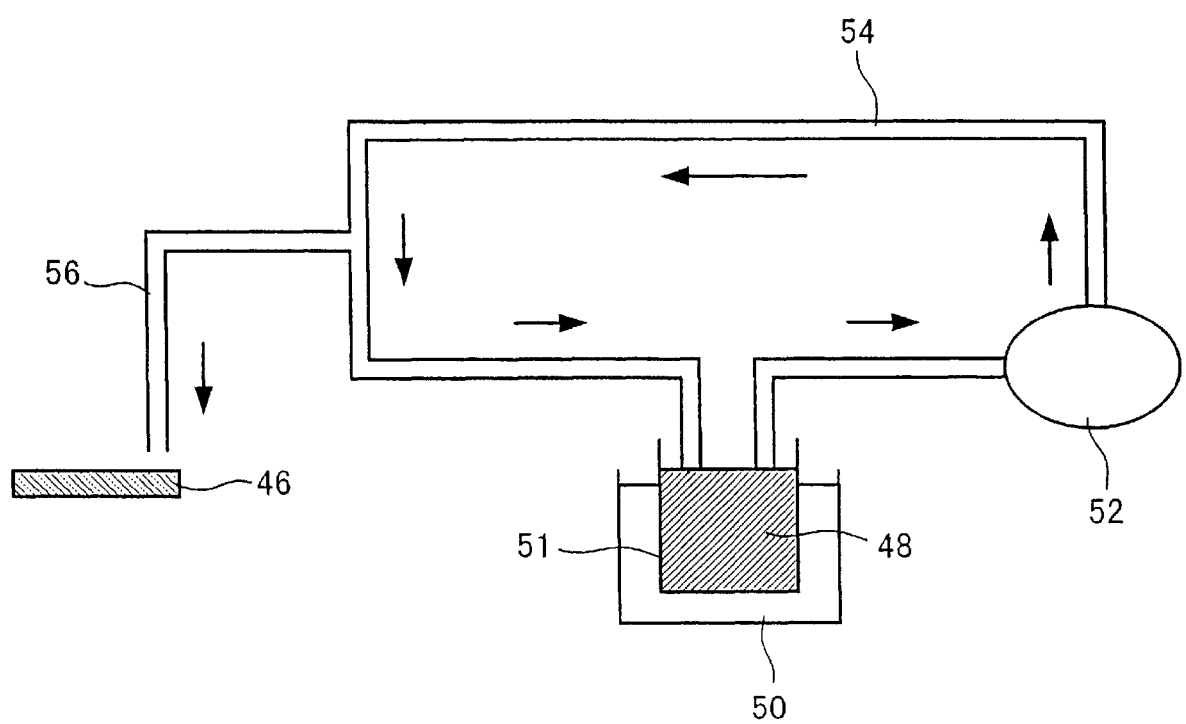
FIG. 5 is a diagram showing the whole system using the CMP apparatus shown in FIG. 4.

FIG. 4 is a cross sectional view showing a part of a CMP apparatus according to a first preferred embodiment of the present invention. FIG. 5 is a diagram showing the whole system using the CMP apparatus shown in FIG. 4. A polishing pad 42 is supported on a turntable 40, which rotates during a polishing process. A semiconductor wafer 46 is arranged so that a surface to be polished faces the polishing pad 42. Polishing slurry 48 is supplied between the polishing pad 42 and semiconductor wafer 46 through a supplying pipe 56. The polishing slurry 48 is controlled in temperature. The polishing pad 42 and semiconductor wafer 46 are moved or slide relatively under a predetermined pressure, which is usually determined in accordance with characteristics of the slurry, polishing speed, etc., for example, about 3 to 4 psi (pounds per square inch).

Now referring to FIG. 5, a CMP apparatus (system) of the first preferred embodiment includes a thermostatic chamber 50 and a slurry tank 51 in which the polishing slurry 48 is stored. The slurry tank 51 is put in the thermostatic chamber 50. The thermostatic chamber 50 is controlled in temperature in a range between 2° C. to 20° C. The apparatus further includes a circulating pump 52; a circulating pipe 54 and a supply pipe 56. The circulating pump 52 allows the polishing slurry 48 circulate in the circulating pipe 54 so as to maintain the temperature and density of the polishing slurry 48. The supply pipe 56 is connected to the circulating pipe 54. The polishing slurry 48 is supplied from the supply pipe 56 toward the polishing pad 46.

According to the above-describe first preferred embodiment, the polishing slurry 48 is controlled in temperature in a range between 2° C. to 10° C., so that a chemical reaction of the Cu layer (18) is restricted and removing speed of the Cu layer 18 is decreased as compared to using polishing slurry at the room temperature. If the temperature of the slurry is too low, the slurry solution would be decreased in amount and it would be difficult to carry out sufficient polishing. On the other hand, if the temperature of the slurry is too high, a reaction speed of the Cu layer 18 and polishing slurry 48 would be increased, and therefore, it would be difficult to control the polishing speed (polishing rate). For those reasons, according to this embodiment, the polishing slurry 48 is controlled in temperature to be in a range between 2° C. to 10° C. In a CMP process, chemical reactions are made between the Cu layer 18 and polishing slurry 48, for example, complex production reaction and oxidation reaction in this embodiment. Such reacted products are removed to polish the wafer. The reaction speed is depends greatly on the reaction temperature. When the reaction temperature is decreased, the reaction speed is decreased as well. According to this embodiment, in which a cooled slurry is used for polishing, the chemical reaction of the Cu layer 18 is restricted, and therefore, the polishing speed of the Cu layer 18 is decreased as compared to a polishing process using a room temperature slurry. As a result, it becomes easier to detect the end point of the polishing process, and therefore, the dishing phenomenon can be suppressed or reduced. Consequently, the semiconductor device will have an optimum height of conductive pattern (18). According to the first preferred embodiment, cooled slurry is supplied onto a surface of the wafer, so that the polishing surface is maintained at a lower temperature. It is suppressed that the temperature of the polishing surface is increased; therefore, the end point of the polishing process can be detected easily and precisely.

Figure 6:
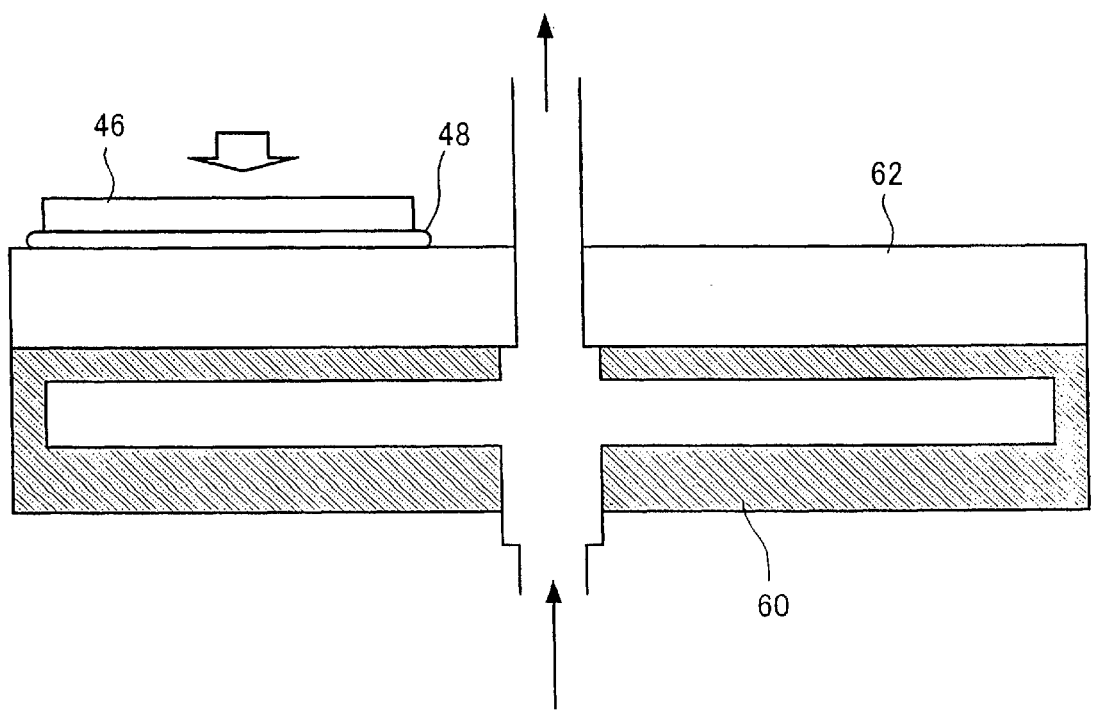
FIG. 6 is a cross sectional view showing a part of a CMP apparatus according to a second preferred embodiment of the present invention.

FIG. 6 is a cross sectional view showing a part of a CMP apparatus according to a second preferred embodiment of the present invention. In this embodiment, the same or corresponding components to those in the first preferred embodiment are represented by the same reference numerals, and the same description is not repeated. The CMP apparatus according to the second preferred embodiment includes a turntable (rotatably provided table) 60 and a polishing pad 62. The feature of this embodiment is that a cooler path is formed through the turntable 60, which has a higher heat capacity as compared to the polishing pad 62.

Cooling water is supplied to the cooler path to cool down the turntable 60, so that heat generated during the polishing process is absorbed into the cooling water. The cooling water may be controlled in a range between about 5° C. and 15° C. According to the second preferred embodiment, the polishing pad 62 and polishing slurry 48 are controlled in temperature at an optimum lower level; and therefore, the advantage of the first preferred embodiment is further improved. Namely, polishing speed of the Cu layer (18) can be controlled more reliably as compared to the first preferred embodiment.

Figure 7:
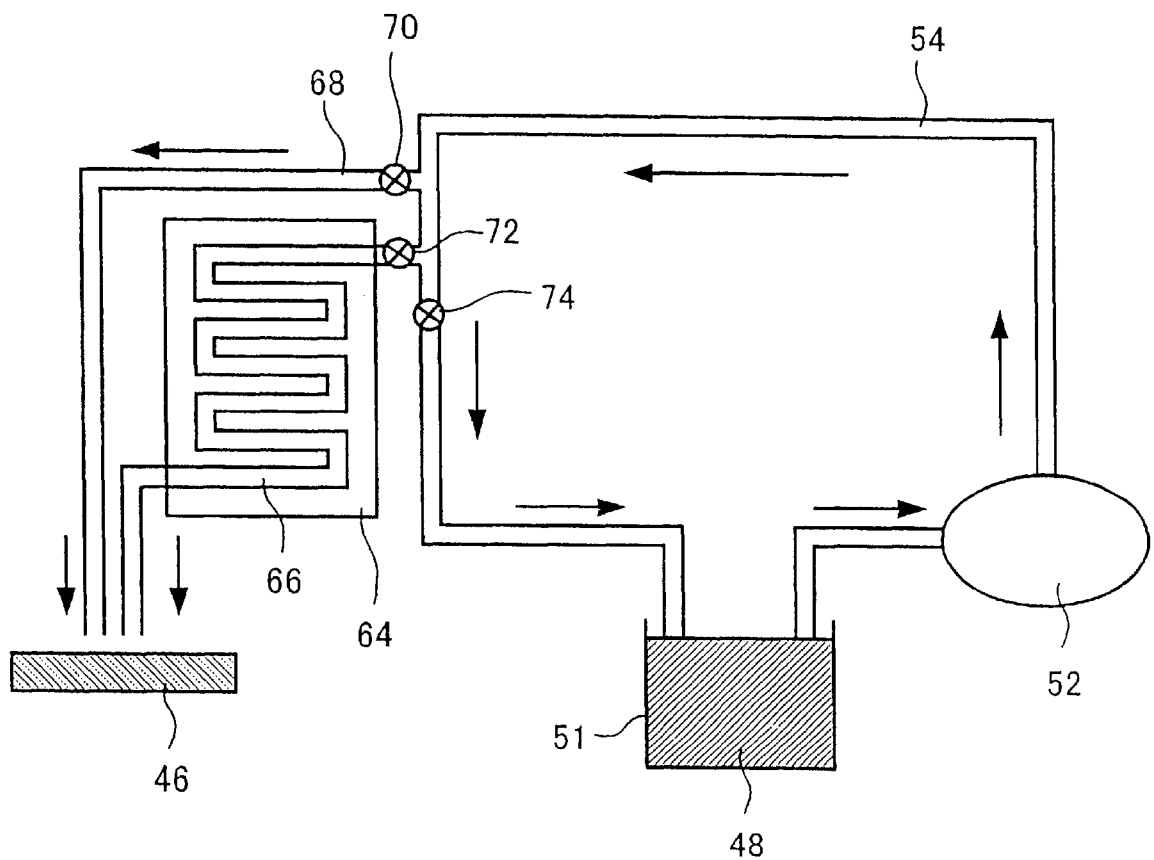
FIG. 7 is a diagram showing a CMP system according to a third preferred embodiment of the present invention.

FIG. 7 is a diagram showing a CMP system according to a third preferred embodiment of the present invention. In this embodiment, the same or corresponding components to those in the first and second preferred embodiments are represented by the same reference numerals, and the same description is not repeated. The CMP system includes a slurry tank 51 in which the polishing slurry 48 is stored; a circulating pump 52; a circulating pipe 54; supply pipes 66 and 68; and a thermostatic chamber 64. The supply pipes 66 and 68 are connected to the circulating pipe 54. The supply pipe 66 has a winding shape and is arranged in the thermostatic chamber 64. The thermostatic chamber 64 is controlled in temperature in a ranged between 2° C. to 10° C.

The CMP system further includes valves 70, 72 and 74. The valve 70 is provided between the circulating pipe 54 and supply pipe 68. The valve 72 is provided between the circulating pipe 54 and supply pipe 66. The valve 74 is provided in the circulating pipe 54. When a CMP process is out of operation, the valves 70 and 72 are closed but the valve 74 is opened so that the polishing slurry 48 is circulated through the circulating pipe 54. When a CMP process is in operation, the valve 74 is closed but one of the valves 70 and 72 is selectively opened.

Figure 8A:
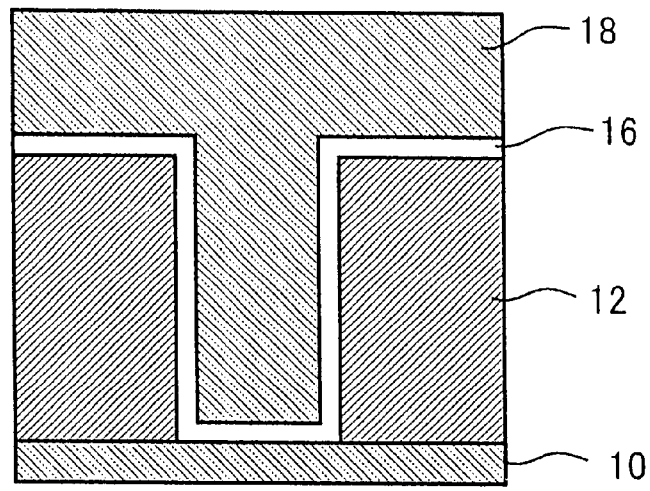
FIGS. 8A to 8C are cross sectional views showing polishing steps of the third preferred embodiment, shown in FIG. 7.
Figure 8B:
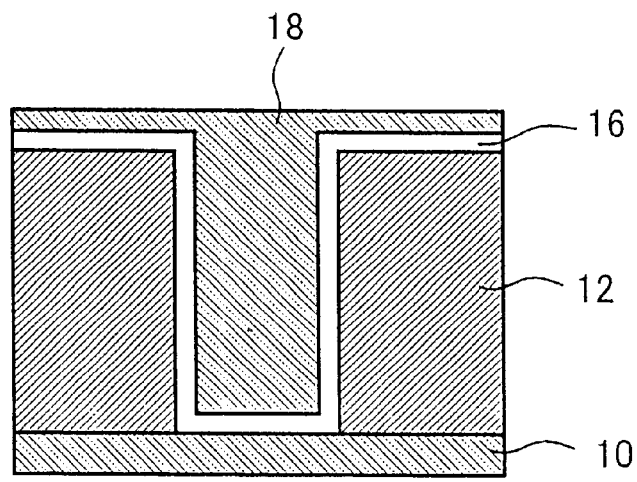
Figure 8C:
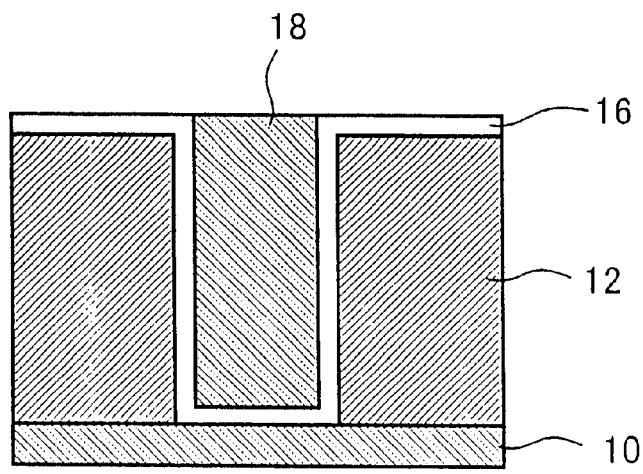

In operation, when the valve 70 is opened and the valves 72 and 74 are closed, the polishing slurry 48 at room temperature is supplied toward the polishing pad 46. The semiconductor wafer is polished with a slurry 48 at the room temperature until 80% to 99% of the whole polishing process is completed, as shown in FIG. 8B. It is the first step of polishing process. After that, when the valve 72 is opened and the valves 70 and 74 are closed, a polishing slurry 48 that is controlled in temperature at 2° C. to 10° C. is supplied toward the polishing pad 46. The semiconductor wafer is polished with the slurry 48, which is cooled, until the whole polishing process is completed, as shown in FIG. 8C. It is the second step of polishing process.

According to the third preferred embodiment, the Cu layer 18 is first polished with the slurry at the room temperature then with the slurry at a temperature of 2° C. to 10° C., so that dishing phenomenon can be decreased without lowering the throughput of the whole polishing process and taking long processing time. In the third preferred embodiment, a turntable having a cooler path can be used in the same manner as the second preferred embodiment.

What is claimed is:

1. A method of forming a conductive pattern, comprising:
   providing a semiconductor wafer;
   providing the semiconductor wafer with a conductive layer; and
   performing a chemical mechanical polishing process, said performing including:
      using a polishing slurry that is at room temperature to polish a surface of the conductive layer, so as to leave the semiconductor wafer with an unneeded portion of the conductive layer; and
      after said using, lowering a temperature of the polishing slurry to form a lower temperature slurry that is below room temperature, and polishing and removing the unneeded portion of the conductive layer using the lower temperature slurry to form the semiconductor wafer with a conductive pattern.

2. The method recited in claim 1, further comprising controlling the temperature of the lower temperature slurry to be in a range between about 2° C. and about 10° C.

3. The method recited in claim 1, wherein the conductive layer is copper.

4. The method recited in claim 1, wherein said using includes polishing the surface of the conductive layer using the slurry that is at room temperature until about 80% to about 99% of an entire polishing process for forming the conductive pattern is performed.

5. The method recited in claim 1, further comprising providing a table; arranging a polishing pad on the table; locating the semiconductor wafer on the polishing pad; and cooling said table while the chemical mechanical polishing process is performed.

6. A method of forming a conductive pattern, comprising:
   providing a semiconductor wafer;
   providing the semiconductor wafer with an insulating layer;
   forming a trench in the insulating layer;
   filling the trench with a conductive material to form a conductive layer over the trench and on the insulating layer; and
   performing a chemical mechanical polishing process, said performing including:
      using a polishing slurry that is at room temperature to polish a surface of the conductive layer, so as to leave a part of the conductive layer on the insulating layer; and
      after said using, lowering a temperature of the polishing slurry to form a lower temperature slurry that is below room temperature, and polishing and removing part of the conductive layer left on the insulating layer using the lower temperature slurry to form a conductive pattern in the trench.

7. The method recited in claim 6, further comprising controlling the temperature of the lower temperature slurry to be in a range between about 2° C. and about 10° C.

8. The method recited in claim 6, wherein the conductive material is copper.

9. The method recited in claim 6, wherein said using includes polishing the surface of the conductive layer using the slurry that is at room temperature until about 80% to about 99% of an entire polishing process for forming the conductive pattern is performed.

10. The method recited in claim 6, further comprising providing a table; arranging a polishing pad on the table; locating the semiconductor wafer on the polishing pad; and cooling said table while the chemical mechanical polishing process is performed.

11. A method of polishing a semiconductor wafer, comprising:
   using a polishing slurry that is at room temperature to rapidly polish a surface of the semiconductor wafer, until about 80% to about 99% of an entire polishing process is performed; and
   after said using, lowering a temperature of the polishing slurry to form a lower temperature slurry that is below room temperature, and slowly polishing the surface of the semiconductor wafer using the lower temperature slurry to complete the entire polishing process.

12. The method recited in claim 11, wherein the polishing slurry that is at room temperature reacts rapidly with the semiconductor wafer to allow the surface of the semiconductor wafer to be rapidly polished, and the lower temperature slurry reacts slowly with the semiconductor wafer to allow the surface of the semiconductor wafer to be slowly polished.

* * * * *